United States Patent [19]
Chung et al.

[11] Patent Number: 5,094,981
[45] Date of Patent: Mar. 10, 1992

[54] TECHNIQUE FOR MANUFACTURING INTERCONNECTIONS FOR A SEMICONDUCTOR DEVICE BY ANNEALING LAYERS OF TITANIUM AND A BARRIER MATERIAL ABOVE 550° C.

[75] Inventors: Henry W. Chung, Cupertino; Tsui Y. Yao, Saratoga, both of Calif.

[73] Assignee: North American Philips Corporation, Signetics Div., Sunnyvale, Calif.

[21] Appl. No.: 510,328

[22] Filed: Apr. 17, 1990

[51] Int. Cl.$^5$ .............................. H01L 21/90
[52] U.S. Cl. .................. 437/190; 437/192; 437/194; 437/200
[58] Field of Search ........... 437/190, 192, 195, 194, 437/200

[56] References Cited

U.S. PATENT DOCUMENTS

| | | | |
|---|---|---|---|
| 4,477,310 | 10/1984 | Park et al. | 437/200 |
| 4,782,380 | 11/1988 | Shankar et al. | 431/190 |
| 4,829,024 | 5/1989 | Klein et al. | 437/192 |
| 4,884,123 | 11/1989 | Dixit et al. | 437/192 |
| 4,886,764 | 12/1989 | Miller et al. | 437/200 |

FOREIGN PATENT DOCUMENTS

| | | |
|---|---|---|
| 190070 | 8/1986 | European Pat. Off. |
| 269211 | 6/1988 | European Pat. Off. |
| 62-213159 | 9/1987 | Japan . |
| 62-237724 | 10/1987 | Japan . |

OTHER PUBLICATIONS

C. Y. Ting et al, "The Use of Ti-Based Contact Barrier Layers in Silicon Technology", *Thin Solid Films*, vol. 96 (1982) pp. 327-345.

P. B. Ghate et al, "Application of TiW Barrier Metallization for Integrated Circuits," *Thin Solid Films*, vol. 53 (1978) pp. 117-128.

R. S. Nowicki et al, "Studies of the TiW/Au Metallization on Aluminum," *Thin Solid Films*, vol. 53 (1978) pp. 195-205.

*Primary Examiner*—Brian E. Hearn
*Assistant Examiner*—Laura M. Holtzman
*Attorney, Agent, or Firm*—A. Tamoshunas; J. Haken; R. Meetin

[57] ABSTRACT

Electrical connections to specified semiconductor or electrically conductive portions (18, 26, and 30) of a structure created from a semiconductive body (10) are created by a process in which a titanium contact layer (34) is deposited on the structure over the specified portions. An electrically conductive barrier material layer (36) which consists principally of non-titanium refractory material is formed over the contact layer. The resulting structure is then annealed at a temperature above 550° C. in order to lower the contact resistance. The anneal is preferably done at 600° C. or more for 10-120 seconds in a gas whose principal constituent is nitrogen. An electrically conductive primary interconnect layer is formed over the barrier material layer after which all three layers are patterned to create a composite interconnect layer.

25 Claims, 3 Drawing Sheets

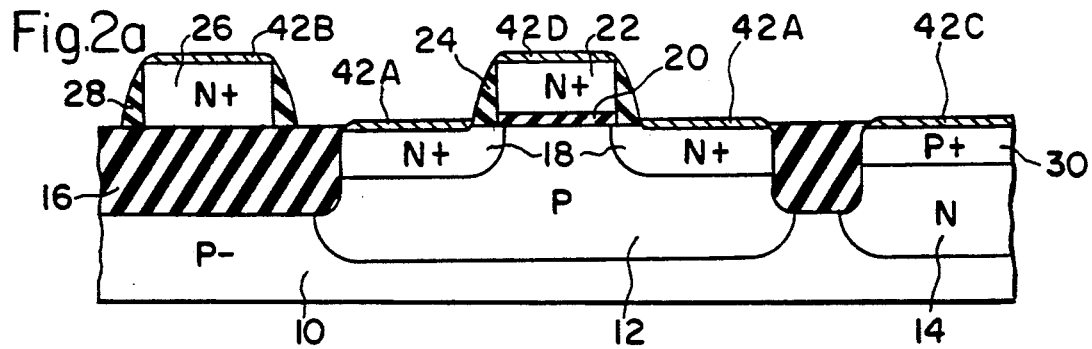
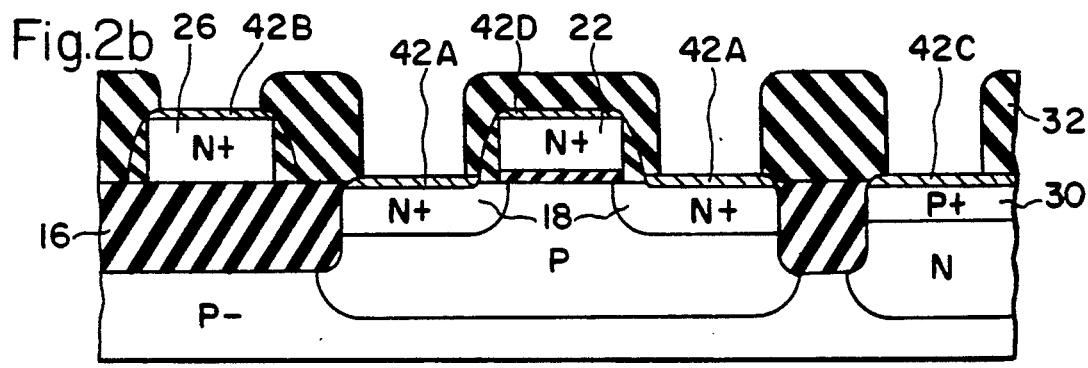
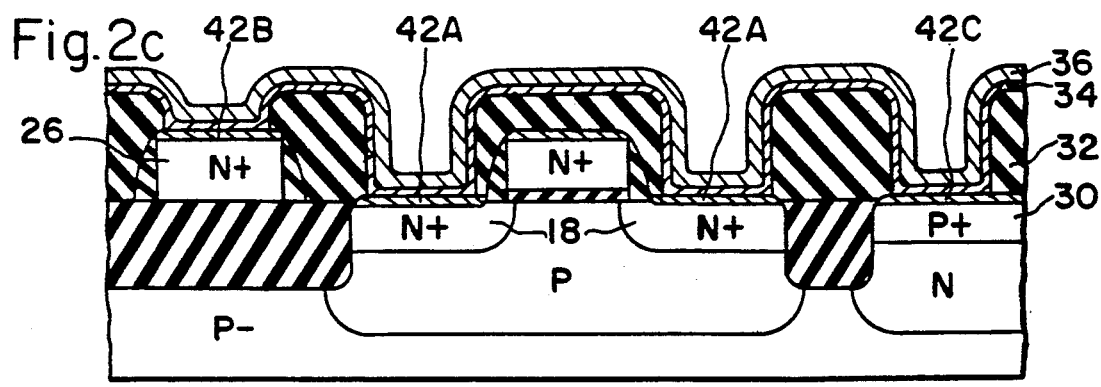
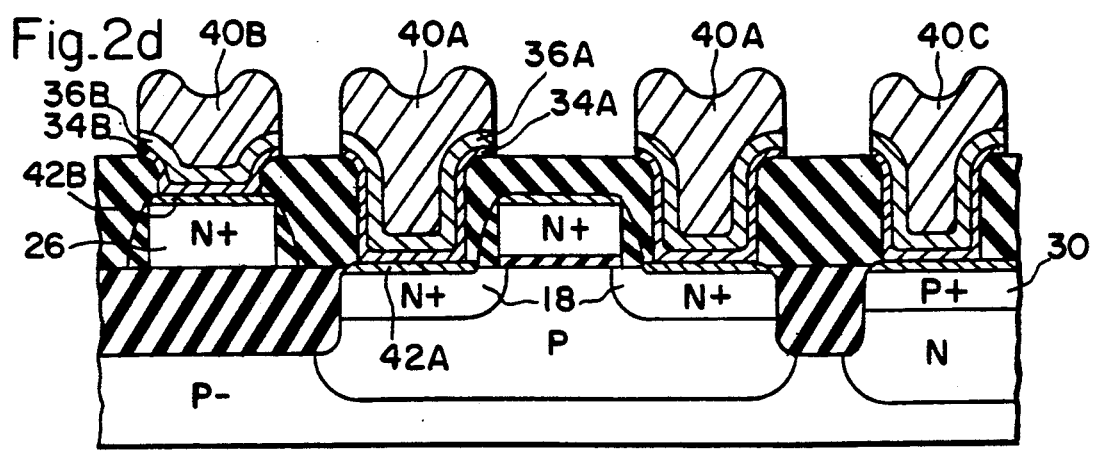

TECHNIQUE FOR MANUFACTURING INTERCONNECTIONS FOR A SEMICONDUCTOR DEVICE BY ANNEALING LAYERS OF TITANIUM AND A BARRIER MATERIAL ABOVE 550° C.

FIELD OF USE

This invention relates to the manufacture of semiconductor devices and, more particularly, to techniques for use in fabricating the electrical interconnection system of a semiconductor integrated circuit ("IC").

BACKGROUND ART

Aluminum is generally used as the primary interconnect metal in ICs created from silicon semiconductor material. In the early years of IC manufacture, selected parts of an aluminum interconnect layer in a silicon IC normally made direct contact with the silicon. During IC operation, some of the aluminum often diffused into the region occupied by the silicon, and vice versa. This phenomenon, sometimes referred as "aluminum spiking", led to undesirably early device failure. Accordingly, current silicon ICs typically employ an electrically conductive barrier material between the aluminum and silicon in order to inhibit Al-Si interdiffusion.

A number of refractory metals, metallic mixtures, and metallic compounds have been studied for use as the barrier material. Tungsten, titanium-tungsten (a tungsten-rich mixture), and titanium niatride (a compound) are among the most discussed barrier-material candidates.

For example, in U.S. Pat. No. 4,782,380, Shankar et al utilize either titanium-tungsten or titanium nitride as the barrier material. The starting point in Shankar et al is a structure in which a contact opening extends through an oxide layer down to a monocrystalline silicon ("monosilicon") substrate underlying the oxide. A titanium-tungsten or titanium nitride barrier material layer is formed over the oxide and exposed silicon. A rapid thermal anneal ("RTA") is performed on the resulting structure for 30-60 seconds in a nitrogen-containing ambient at a temperature in the range of 500°-800° C. A layer of aluminum or an alloy of aluminum is then deposited over the barrier material layer.

Turning back to the RTA, performance of the RTA in a nitrogen-containing atmosphere enables a nitride-rich skin to form on the exposed surface of the barrier material. This improves the diffusion barrier. A titanium silicide layer forms along the silicon/barrier material interface during the RTA in certain of the embodiments. Although not discussed in Shankar et al, the nitrogen also appears to be responsible for an action that inhibits undesired lateral growth of the titanium silicide. Vadjikar et al, "The Effect of Processing Environment on the Lateral Growth of Titanium Silicide," *J. Electrochem Soc.*, Oct. 1988, pp. 2582-2586, discuss this phenomenon in more detail.

In several titanium nitride embodiments of Shankar et al, an elemental titanium contact layer is deposited on the structure prior to titanium-nitride formation. A very similar technique, including an RTA after titanium nitride barrier material deposition, is employed by Asahina in published Japanese patent application 63-84024. It appears that all of the titanium is converted into titanium nitride or titanium silicide in both Asahina and Shankar et al.

There are major disadvantages with the preceding interconnect formation techniques. The present inventors investigated the titanium-tungsten technique and found that the resulting contact resistance to heavily doped P-type monosilicon was higher than that for a simple aluminum contact to heavily doped P-type monosilicon. This is highly undesirable. As to the titanium-nitride techniques, preparation of reproducible well-controlled titanium nitride layers poses severe processing difficulties.

Shishino, published Japanese patent application 62-213159, also describes an interconnect fabrication technique in which a titanium contact layer is created prior to barrier material formation. The titanium contact layer is deposited on an oxide layer and into a contact opening down to a P-type or N-type zone of an underlying monosilicon substrate. A titanium-tungsten barrier material layer is deposited on the Ti layer. After an aluminum layer is deposited on the titanium-tunsten, selected portions of the three-layer stack are removed to create a desired interconnect pattern. The resulting structure is then annealed at 450° C. in a nitrogen-containing ambient.

Shishino claims that his process results in lowered contact resistance and good barrier material characteristics. While the contact resistance in Shishino may actually be reduced, the present inventors' investigation of Shishino's work indicates that his contact resistance may not be low enough for future long-life applications.

GENERAL DISCLOSURE OF THE INVENTION

The present invention is a technique for providing a semiconductor device with electrical interconnections that have low contact resistance and avoid undesired interdiffusion with adjoining material. More specifically, the invention is a method of fabricating electrical connections to specified portions of a structure created from a semiconductive body. Each of these specified portions consists of semiconductor material or electrically conductive material.

In the invention, a titanium contact layer is deposited on the structure over the specified portions so as to make electrical contact with the specified portions. The thickness of the Ti contact layer may be as little as 150 angstroms. An electrically conductive barrier material layer which consists principally of non-titanium refractory material is formed over the contact layer. The barrier material layer is preferably formed with a material consisting principally of tungsten, such as titanium-tungsten or tungsten itself, but may be formed with molybdenum, tantalum, titanium-molybdenum (a molybdenum-rich mixture), titanium-tantalum (a tantalum-rich mixture), or any combination of these six materials. As used herein, "principally" (or "principal") means majority by weight.

An anneal is performed on the then-existent structure at a temperature greater than 550° C. The anneal reduces high contact resistances that occur where the specified portions meet the contact layer. The anneal is preferably an RTA of 10-120 seconds at 600° C. or more. The RTA environment consists principally of a nitrogen-containing gas such as molecular nitrogen, ammonia, or a combination of these two gases.

After the anneal, a primary electrically conductive interconnect layer preferably consisting of aluminum or an aluminum alloy is formed over the barrier material layer. Portions of the three layers are selectively removed so as to leave the remainder of the layers in a desired interconnect pattern. This completes the basic fabrication technique of the invention. The remaining material of the three layers forms a composite interconnect layer.

Experimental semiconductor devices were manufactured in which the present invention was used to make composite interconnect layers that contacted heavily doped P-type monosilicon, heavily doped N-type monosilicon, heavily doped N-type polycrystalline silicon ("polysilicon"), tungsten silicide (on polysilicon), and titanium silicide (on both monosilicon and polysilicon). All of these contacts exhibited very low contact resistance. In particular, the contact resistance was low enough for upcoming long-life high-performance applications. The other contact and barrier material characteristics, including the ability of the barrier material to inhibit Al-Si interdiffusion, were also fully satisfactory.

During the RTA, thin titanium silicide layers formed along the contact surfaces to monosilicon and polysilicon. The reason for performing the anneal in a nitrogen-containing atmosphere was to prevent the titanium silicide from growing laterally. Based on what Kramer discloses in "The MEGA Project: some aspects of ULSI Technology," *Extended Abstracts, Electrochem. Soc.*, Spring Meeting, 7-12 May 1989, pp. 182-183, one might expect the barrier material t inhibit the ability of the nitrogen to prevent lateral growth of titanium silicide during the RTA. However, no undesired lateral growth of the silicide was observed. The invention thereby provides a somewhat surprising result that is highly beneficial.

BRIEF DESCRIPTION OF THE DRAWINGS

FIGS. 2a, 2b, 2c, and 2d are cross-sectional structural views representing steps in another embodiment of a process for manufacturing a composite interconnect layer in accordance with the invention.

Figure 1A:
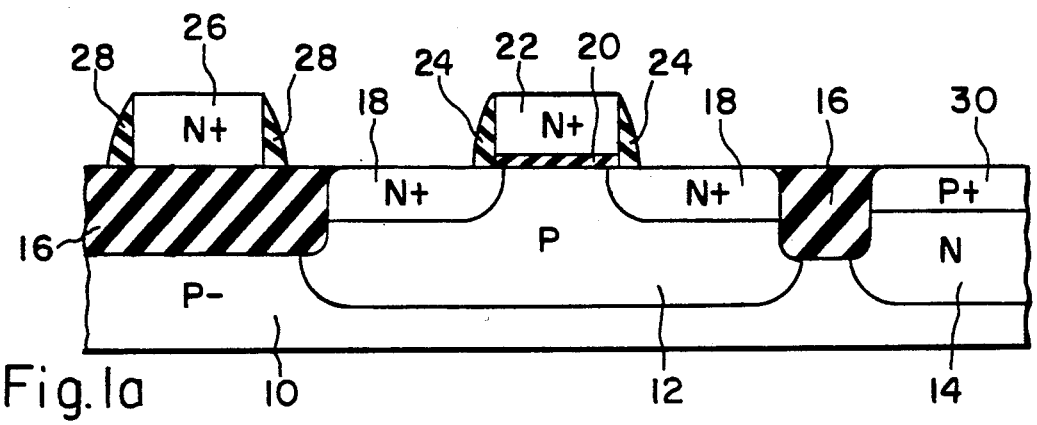
FIGS. 1a, 1b, 1c, 1d, and 1e are cross-sectional structural views representing steps in an embodiment of a process for supplying a semiconductor device with a composite interconnect layer in accordance with the invention.

Like reference symbols are employed in the drawings and in the description of the preferred embodiments to represent the same or very similar item or items. In the drawings and in the description of the preferred embodiments, the symbols "P+" and "N+" indicate heavy doping. The symbols "P−" and "N−" denote light doping. The symbols "P" and "N" indicate intermediate doping.

DESCRIPTION OF THE PREFERRED EMBODIMENTS

The present invention can be used to provide electrical connections to various types of structures formed from semiconductive bodies. FIGS. 1a-1e illustrate a typical application of the invention to a structure containing an N-channel insulated-gate field-effect transistor ("FET"). FIGS. 1a-1e also contains regions that could, for example, be readily used to form a complementary P-channel insulated-gate FET.

The structure in FIG. 1a has been created in a conventional manner from a semiconductive body (or substrate) 10 that is part of a IC wafer. Substrate 10 contains a P well 12 and an N well 14 located along the upper substrate surface. A planarized web-like field region 16 of silicon dioxide penetrates several thousand angstroms into substrate 10. Field-oxide region 1 divides the upper part of substrate 10 into a group of laterally isolated active device regions, of which the monosilicon components of the N-channel FET are here formed in one of these device regions.

The major components of the N-channel FET are a pair of surface-adjoining N+ source/drain zones 18 laterally separated from each other in P well 12, a thin silicon-dioxide gate dielectric layer 20 located along the upper substrate surface above the channel region between source/drain zones 18, and an N+polysilicon gate electrode 22 lying on dielectric layer 20. A pair of silicon-dioxide spacers 24 lie along the sides of gate electrode 22.

An N+ polysilicon portion 26 sandwiched between a pair of silicon-dioxide spacers 28 lies on field-oxide region 16. Polysilicon portion 26 typically represents an extension of gate electrode 22.

N well 14 contains a P+ zone 30 located along the upper substrate surface. Zone 30 could be a source/drain zone for the P-channel FET.

Figure 1B:
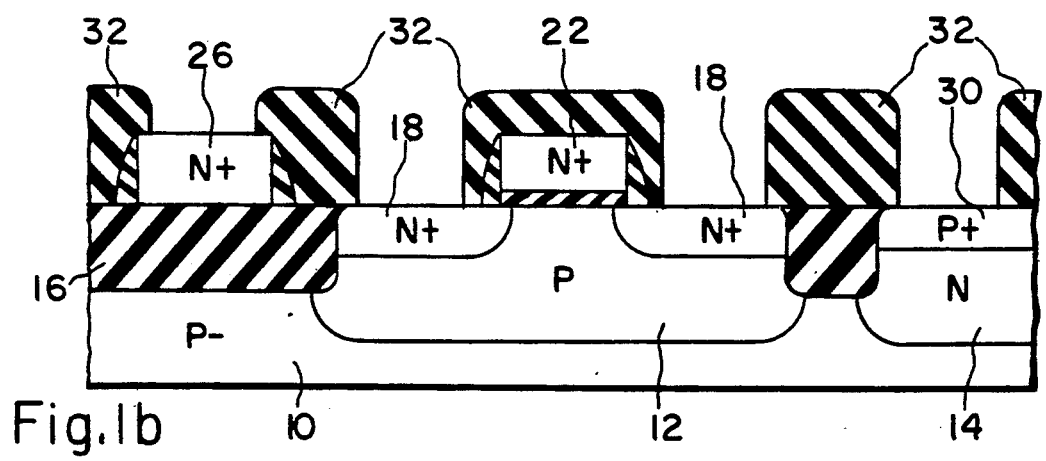

Electrical connections for the structure in FIG. 1a are created by first depositing a layer of boron-doped phosphosilicate glass ("BPSG"), or another such electrical insulator, on the upper surface of the structure to a thickness of several thousand angstroms. The BPSG layer is normally planarized according to a conventional technique. Using a suitable photoresist mask, contact openings are etched through the BPSG layer in a standard manner down to N+ monosilicon zones 18, P+ monosilicon zone 30, and N+ polysilicon portion 26. Referring to FIG. 1b, items 32 denote the remainder of the BPSG layer.

Metalization is initiated by placing the wafer containing the structure of FIG. 1b into the deposition chamber of a conventional sputter deposition system such as the 3125 S-gun machine made by Varian Associates. The chamber pressure is reduced to about $10^{-7}$ torr, and the structure is pre-heated to 250° C. Without preforming a sputter etch to clean the upper surfaces of silicon zones 18, 26, and 30, a contact layer 34 of titanium is sputter deposited on the upper surface of the structure to a thickness of 150-1,000 angstroms, preferably 200 angstroms. Ti contact layer 34 substantially makes electrical contact with silicon zones 18, 26, and 30 as shown in FIG. 1c.

A metallic barrier material layer 36 consisting principally of non-titanium refractory material is deposited on Ti layer 34. The barrier material should meet the following criteria. It should strongly inhibit diffusion of alumimum into silicon and vice versa. The barrier material should not interact significantly with titanium during the anneal step (described below). Titanium silicidation should take place at a lower temperature than silicidation of the barrier material.

The barrier material normally consists principally of tungsten. The main candidates for layer 36 are titanium-tungsten and tungsten itself. Note that titanium-tungsten contains a relatively small fraction of titanium, typically 10-15% by weight, and thus consists principally of tungsten. Barrier material layer 36 is preferably formed with 1000 angstroms of titanium-tungsten sputter deposited in the same deposition chamber as Ti layer 34 without breaking the chamber vacuum. Nonetheless, the barrier material may also consist of molybdenum, tantalum, titanium-molybdenum, titanium-tantalum, or a combination of any of the materials specified in this paragraph. Titanium-molybdenum and titanium-tantalum mean mixtures which, like titanium-tungsten, have a titanium weight percentage substantially less than 50%.

Figure 1C:
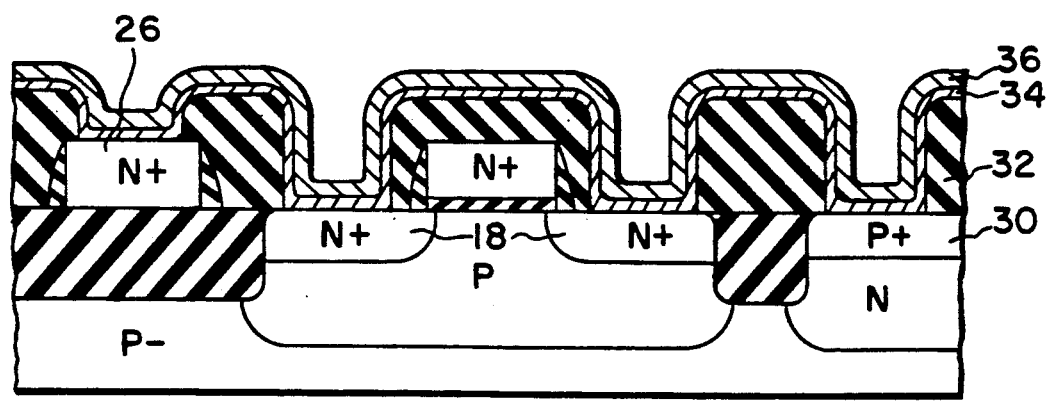

After removing the wafer from the sputter deposition chamber, the structure of FIG. 1c is annealed at a temperature greater than 550° C. The purpose of the anneal is to improve the barrier material properties, improve the characteristics at the interfaces where Ti layer 34 contacts silicon zones 18, 26, and 30, and reduce high contact resistances at these interfaces.

The anneal is preferably an RTA done in a conventional annealing system such as the ALP 6000 rapid thermal processor made by Peak Systems. The RTA is performed at 600° C. or more for 10-120 seconds in a gas whose principal constituent is nitrogen. Suitable candidates for the anneal gas are molecular nitrogen (i.e., $N_2$), ammonia, and a combination of these gases, possibly in further combination with a small fraction of hydrogen. The preferred RTA conditions are 620° C. for 15-30 seconds in an $N_2$ ambient.

Figure 1D:
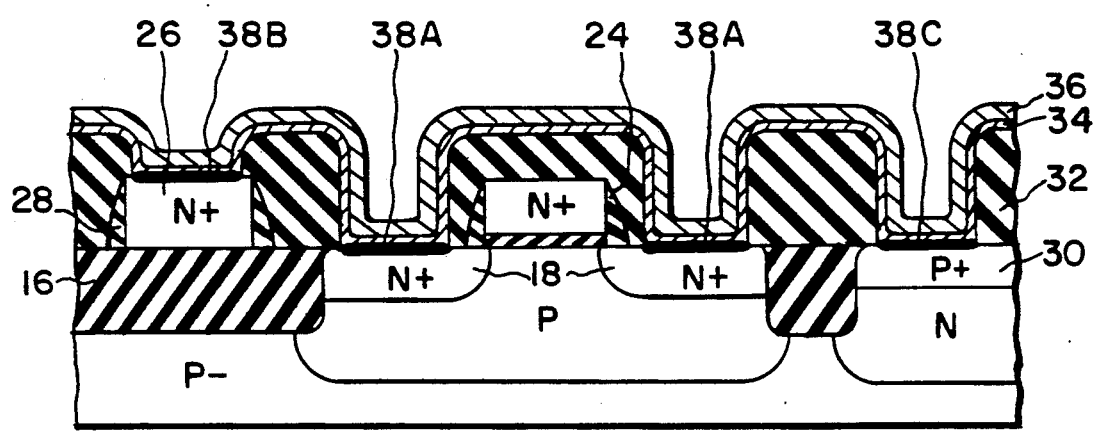

During the RTA, layers 38A of titanium silicide form along the Ti/N+ monosilicon interfaces in the N-channel FET as shown in FIG. 1d. A titanium silicide layer 38B grows along the Ti/N+polysilicon interface. Similar silicide growths occur in the P-channel FET. Item 38C is a titanium silicide layer that grows along the upper surface of P+ source/drain zone 30. Silicide layers 38A-38C help to improve the contact characteristics by alleviating interface damage.

The thickness of silicide layers 38A-38C depends on the RTA conditions. If the RTA temperature and/or time are great enough, all of the titanium above silicon zones 18, 26, and 30 may be converted into titanium silicide.

The lateral extent of silicide layers 38A-38C is substantially limited to the upper surface areas of zones 18, 26, and 30. That is, layers 38A-38C do not bridge across any of oxide regions 16, 24, and 28 so as to short out parts of the FETs. The nitrogen utilized during the RTA appears to produce an action that inhibits such lateral growth.

A thin titanium nitride layer, not shown in the drawings, grows along the upper surface of barrier material layer 36 during the RTA. The titanium-nitride layer improves the ability of layer 36 to prevent Al-Si interdiffusion. Depending on the RTA conditions some of the titanium along BPSG portions 32 also combines with oxygen from the BPSG to form somewhat complex titanium/silicon oxide layers, not shown in the drawings, along the Ti/BPSG interfaces.

A primary interconnect layer consisting substantially of aluminum—i.e., pure aluminum or an aluminum alloy—is deposited on layer 36 to a thickness of 6,000-12,000 angstroms using a conventional aluminum deposition system. The primary interconnect layer preferably consists of aluminum with approximately 1% copper (by weight).

Figure 1E:
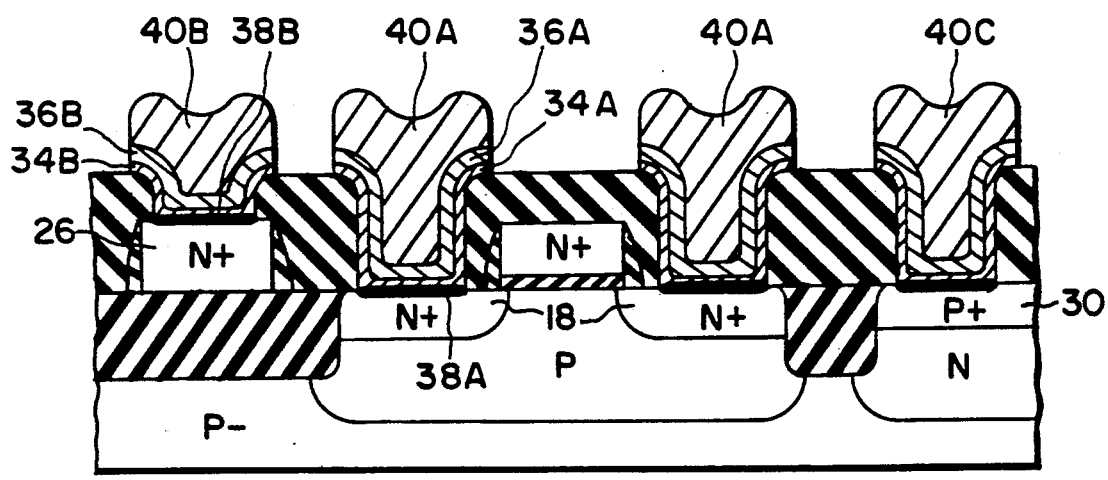

A desired interconnect pattern is now created in the primary interconnect layer and in layers 36 and 34 by selectively etching them using a suitable photoresist mask. The etching is performed in a conventional plasma etch system. FIG. 1e shows the structure at the end of the plasma etch. Items 40A, 40B, and 40C indicate the remaining portions of the deposited aluminum or Al alloy. Portions 40A-40C and the remaining portions of layers 36 and 34 form a composite first level interconnect layer.

To avoid excessive labelling, only the two left-most interconnect contact areas have been fully labelled in FIG. 1e. Items 34A and 36A are the remaining Ti and barrier material portions underlying Al portion 40A at the contact for the leftmost N+ source/drain zone 18. Items 34B and 36B are the remaining Ti and barrier material portions underlying Al portion 40B at the contact for polysilicon portion 26.

FIGS. 2a-2d illustrate an alternative application of the invention to a structure containing an N-channel FET and (part of) a P-channel FET. The structure in FIG. 2a is created from the structure in FIG. 1a by using the conventional "salicide" process. This entails depositing a layer of a noble or refractory metal on the upper surface of the structure in FIG. 1a, annealing the wafer containing the structure at a sufficiently high temperature to convert the metal adjoining the silicon areas into metal silicide, and removing the non-silicided metal over the oxide areas. Items 42A, 42B, 42C, and 42D are the remaining metal silicide portions along the tops of silicon zones 18, 26, 30, and 22. The primary candidates for silicide layers 42A-42D are titanium silicide, tungsten silicide, molybdenum silicide, cobalt silicide, and tantalum silicide.

From this point, BPSG formation and metalization are performed in the same manner as described for FIGS. 1a-1e except that Ti layer 34 contacts metal silicide layers 42A-42C rather than the underlying silicon. FIG. 2b shows the structure after the etching of contact openings through the BPSG layer so as to define BPSG portions 32. After Ti layer 34 and barrier material layer 36 are deposited, the structure appears as shown in FIG. 2c. Thin titanium silicide layers, not shown in the drawings, may form along the interfaces between Ti layer 34 and silicide layers 42A-42C during the RTA. FIG. 2d depicts the post-etch structure which appears substantially the same as the structure in FIG. 1e. The similarity is even closer if, as in the preferred case, layers 42A-42C are titanium silicide.

As another alternative, the conventional "polycide" technique can be used to provide metal silicide along the tops of gate electrode 22 and polysilicon portion 26 but not along the tops of monosilicon zones 18 and 30. Again, the primary candidates are the silicides of titanium, tungsten, molybdenum, cobalt, and tantalum. BPSG delineation and metalization in accordance with the invention are performed in the way described above for FIGS. 1a-1e except that Ti layer 34 now contacts the metal silicide rather than polysilicon portion 26.

Tungsten silicide is the preferred metal silicide for this alternative. In this case, thin titanium silicide layers typically grow along the tungsten silicide/titanium interfaces during the RTA. The post-etch structure is substantially the same as illustrated in FIG. 1e except for the presence of the tungsten silicide layers.

The invention was experimentally verified with wafers having 1.5 micron X 1.5 micron contact openings down to P+ monosilicon, N+ monosilicon, and N+ (phosphorus-doped) polysilicon. In one set of tests, conventional Al alloy contacts to silicon were compared to contacts fabricated according to the invention using 500-angstrom titanium contact layer, 1,000-angstrom titanium-tungsten barrier material layer, RTA at 620° C. for 30 seconds in an $N_2$ atmosphere, and Al alloy primary interconnect. Each of three types of contacts (i.e., to P+ monosilicon, to N+monosilicon, and to N+ polysilicon) made according to the invention exhibited considerably lower contact resistance than the conventional counterpart.

The thickness of the Ti contact layers was studied with contacts processed at the foregoing barrier material, RTA, and primary interconnect conditions. A summary of the experimental data on contact resistance as a function of contact layer thickness is given in the following table:

| Ti Contact Layer | Contact Resistance (Ohms) | | |
|---|---|---|---|
| Thickness (Angstroms) | P+ Monosilicon | N+ Monosilicon | N+ Polysilicon |
| Run A 500 | 18 | 11 | 3 |
| 350 | 19 | 11 | 3 |
| 200 | 19 | 11 | 3 |
| Run B 200 | 20 | 10 | 3 |
| 150 | 23 | 10 | 3 |
| 100 | 36 | 10 | 3 |

The contact resistance data in the table represents the averages of a relatively large amount of data. The contact resistance for each of the three types of contacts was relatively constant and adequately small down to a Ti thickness of 150 angstroms. At 100 angstroms, the contact resistance for the P+ monosilicon contacts increased to an undesirably high value. Consequently, 100 angstroms appeared to be too small for the contact layer thickness. The effect of deleting the RTA was investigated. There was no significant change in the contact resistance for N+ monosilicon and polysilicon contacts. However, the contact resistance for the non-RTA P+ monosilicon contacts was 50–100% higher. This clearly established the need for the RTA.

In tests where the length of the RTA was varied, no significant change in contact resistance occurred when the anneal was reduced from 30 seconds to 15 seconds. Accordingly, an RTA of 15 seconds, and very likely as little as 10 seconds, appears acceptable.

Contacts to P+ polysilicon were not studied in the tests. Nonetheless, it appears highly likely that the contact resistance for contacts to P+ polysilicon should be quite low, especially since contacts to N+ polysilicon have low contact resistance as indicated in the foregoing table.

While the invention has been described with reference to particular embodiments, this description is solely for the purpose of illustration and is not to be construed as limiting the scope of the invention claimed below. For example, the present method could be applied to "self-aligned" contacts whose dimensions are not directly defined by a photoresist mask. The starting structure could be quite different from those described above.

Materials such as copper, tungsten, titanium-tungsten, titanium silicide, and tungsten silicide might be substituted for aluminum as the primary interconnect metal. The invention could also be applied to vias in a multi-level interconnection system. Various modifications and applications may thus be made by those skilled in the art without departing from the true scope and spirit of the invention as defined in appended claims.

We claim:

1. A method of fabricating electrical connections to specified portions of a structure created from a semiconductive body, each specified portion consisting substantially of semiconductor material or electrically conductive material, the method comprising the steps of:

depositing a metallic contact layer, which consists substantially of titanium, on the structure over the specified portions so as to substantially make electrical contact with the specified portions;

forming an electrically conductive barrier material layer, which consists principally of non-titanium refractory material, over the contact layer;

annealing the body, contact layer, and barrier material layer at a temperature greater than 550° C.;

subsequently forming an electrically conductive primary interconnect layer over the annealed material layer such that the primary interconnect layer conforms along substantially its entire extent to the barrier material layer; and removing selected portions of the three layers so as to leave the remainder of the layers in a desired interconnect pattern.

2. A method as in claim 1 wherein the annealing step is performed at 600° C. or more.

3. A method as in claim 2 wherein the annealing step is performed for 10–120 seconds.

4. A method as in claim 3 wherein the annealing step is performed in an anneal gas whose principal constituent is nitrogen in molecular and/or compound form.

5. A method as in claim 4 wherein the anneal gas consists principally of molecular nitrogen, ammonia, or a combination of these two gases.

6. A method as in claim 4 wherein the contact layer has a thickness of 1,000 angstroms or less.

7. A method as in claim 6 wherein the thickness of the contact layer is 150 angstroms or more.

8. A method as in claim 4 wherein the barrier material layer is formed with a material consisting principally of tungsten.

9. A method as in claim 4 wherein the barrier material layer consists substantially of tungsten, titanium-tungsten, molybdenum, titanium-molybdenum, tantalum, titanium-tantalum, or a combination of any of these materials.

10. A method as in claim 1 wherein: at least on of the specified portions consists substantially of N-type monocrystalline silicon; and at least one of the specified portions consists substantially of P-type monocrystalline silicon.

11. A method as in claim 10 wherein, during the annealing step, a titanium silicide layer forms along the contact layer adjacent to each specified portion that consists substantially of monocrystalline silicon.

12. A method as in claim 10 wherein at least one of the specified portions consists substantially of conductively doped polycrystalline silicon.

13. A method as in claim 12 wherein the polycrystalline silicon is of N-type conductivity.

14. A method as in claim 12 wherein, during the annealing step, a titanium silicide layer forms along the contact layer adjacent to each specified portion that consists substantially of silicon.

15. A method as in claim 12 wherein the annealing step is performed for 10–120 seconds at 600° C. or more in an anneal gas whose principal constituent is nitrogen.

16. A method as in claim 10 wherein as least one of the specified portions consists substantially of metal silicide.

17. A method as in claim 16 wherein the metal silicide is titanium silicide, tungsten silicide, molybdenum silicide, cobalt silicide, tantalum silicide, or a combination of these silicides.

18. A method as in claim 17 wherein the annealing step is performed for 10–120 seconds at 600° C. or more in an anneal gas whose principal constituent is nitrogen.

19. A method of fabricating electrical connections to specified portions of a structure created from a semiconductive body, each specified portion consisting substantially of semiconductor material or electrically conductive material, the method comprising the steps of:
   depositing a metallic contact layer, which consists substantially of titanium, on the body over the specified portions so as to substantially make electrical contact with the specified portions;
   forming an electrically conductive barrier material layer, which consists principally of tungsten, over the contact layer;
   annealing the body, contact layer, and barrier material layer at a temperature greater than 550° C.;
   subsequently forming an electrically conductive primary interconnect layer, which consists substantially of aluminum, over the barrier material layer such that the primary interconnect layer conforms along substantially its entire extent to the barrier material layer; and
   removing selected portions of the three layers so as to leave the remainder of the layers in a desired interconnect pattern.

20. A method as in claim 19 wherein the annealing step is performed for 10-120 seconds at 600° C. or more in an anneal gas whose principal constituent is nitrogen.

21. A method as in claim 1 wherein the primary interconnect layer, along substantially its entire extent, either contacts the barrier material layer or is separated from the barrier material layer by an intermediate layer.

22. A method as in claim 21 wherein the annealing step is performed for 10-120 seconds.

23. A method as in claim 22 wherein: at least one of the specified portions consists substantially of silicon; and, during the annealing step, a titanium silicide layer forms along the contact layer adjacent to each specified portion that consists substantially of silicon.

24. A method as in claim 22 wherein the barrier material layer consists principally of tungsten.

25. A method as in claim 1 wherein the primary interconnect layer consists substantially of aluminum.

* * * * *